(12) United States Patent
Yang et al.

(10) Patent No.: US 9,608,135 B2
(45) Date of Patent: Mar. 28, 2017

(54) SOLAR CELL AND METHOD FOR MANUFACTURING THE SAME

(71) Applicant: LG ELECTRONICS INC., Seoul (KR)

(72) Inventors: Youngsung Yang, Seoul (KR); Yongduk Jin, Seoul (KR); Manhyo Ha, Seoul (KR); Juhwa Cheong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 121 days.

(21) Appl. No.: 13/644,287

(22) Filed: Oct. 4, 2012

(65) Prior Publication Data

US 2013/0298975 A1 Nov. 14, 2013

(30) Foreign Application Priority Data

May 11, 2012 (KR) .................. 10-2012-0050315

(51) Int. Cl.
*H01L 31/0224* (2006.01)
*H01L 31/068* (2012.01)
*H01L 31/18* (2006.01)

(52) U.S. Cl.
CPC .. *H01L 31/022425* (2013.01); *H01L 31/0684* (2013.01); *H01L 31/1804* (2013.01); *H01L 31/186* (2013.01); *Y02E 10/547* (2013.01); *Y02P 70/521* (2015.11)

(58) Field of Classification Search
CPC H01L 31/0682; H01L 31/022441–31/022458; H01L 31/0516; H01L 31/022425; H01L 31/0684; H01L 31/186; H01L 31/1804; Y02P 70/521; Y02E 10/547

USPC .................................................. 136/243–265
See application file for complete search history.

(56) References Cited

U.S. PATENT DOCUMENTS

| 4,596,998 A | 6/1986 | Krimmel | |
|---|---|---|---|
| 6,100,466 A * | 8/2000 | Nishimoto | ..................... 136/258 |
| 6,130,380 A * | 10/2000 | Nakamura | ..................... 136/255 |
| 2008/0092944 A1* | 4/2008 | Rubin | ........................... 136/252 |

(Continued)

FOREIGN PATENT DOCUMENTS

| EP | 0735597 A2 | 10/1996 |
|---|---|---|
| EP | 0875945 A2 | 11/1998 |
| EP | 2200084 A1 | 6/2010 |

OTHER PUBLICATIONS

Sopori et al., "A Comprehensive Model of Hydrogen Transport into a Solar Cell During Silicon Nitride Processing for Fire-Through Metallization", 31st IEEE Photovoltaics Specialists, Feb. 2005, pp. 1-4.*

*Primary Examiner* — James Lin
*Assistant Examiner* — Liesl C Baumann
(74) *Attorney, Agent, or Firm* — Birch, Stewart, Kolasch & Birch, LLP

(57) ABSTRACT

A solar cell according to an embodiment includes a semiconductor substrate; a first dopant layer formed at one surface of the semiconductor substrate; and a first electrode electrically connected to the first dopant layer. At least a part of the first dopant layer includes a pre-amorphization element, and a concentration of the pre-amorphization element in one portion of the first dopant layer is different from a concentration of the pre-amorphization element in another portion of the first dopant layer.

9 Claims, 9 Drawing Sheets

(56) References Cited

U.S. PATENT DOCUMENTS

| | | | |
|---|---|---|---|
| 2009/0020156 A1* | 1/2009 | Ohtsuka et al. | 136/256 |
| 2009/0068783 A1* | 3/2009 | Borden | H01L 31/022425 438/57 |
| 2009/0298249 A1* | 12/2009 | Hoentschel | H01L 21/26506 438/302 |
| 2010/0012185 A1 | 1/2010 | Schmid et al. | |
| 2011/0139231 A1* | 6/2011 | Meier et al. | 136/255 |
| 2013/0139884 A1* | 6/2013 | Lee | H01L 31/068 136/258 |

\* cited by examiner

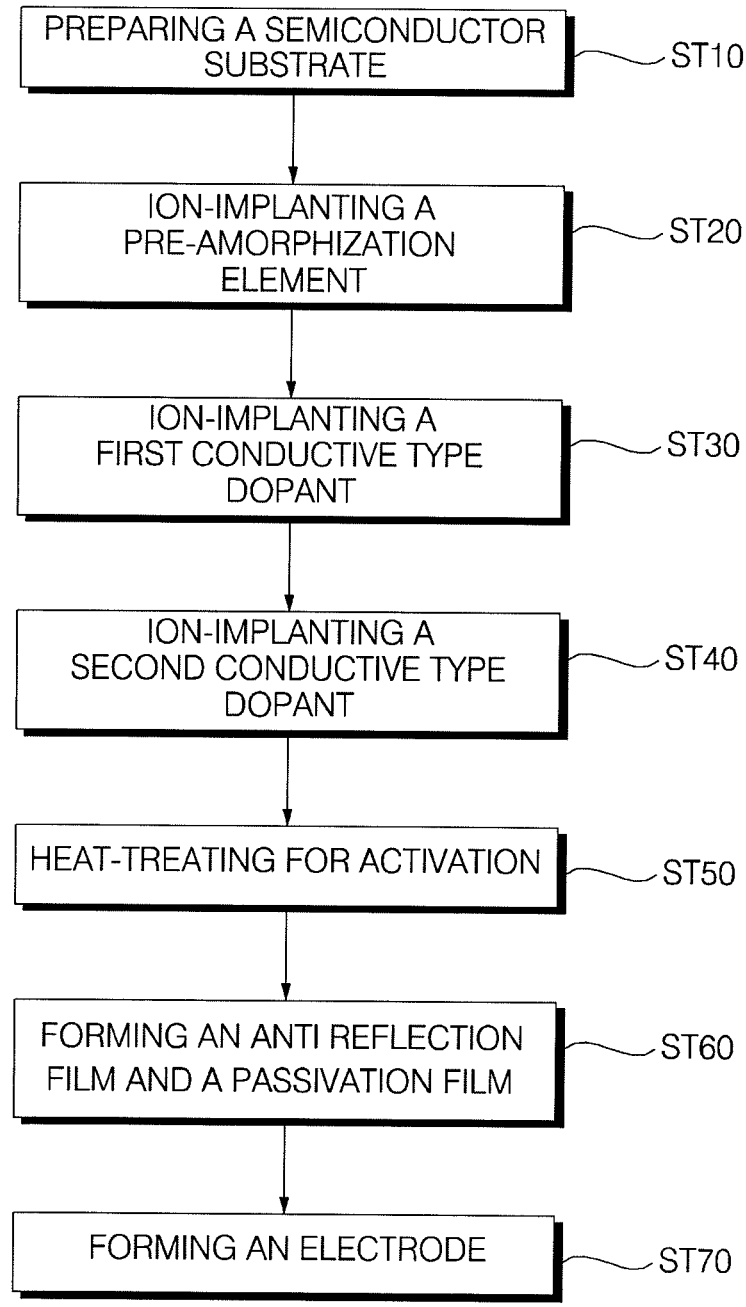

ST10

ST20

SOLAR CELL AND METHOD FOR MANUFACTURING THE SAME

CROSS-REFERENCE TO RELATED APPLICATION

This application claims priority to and the benefit of Korean Patent Application No. 10-2012-0050315, filed on May 11, 2012 in the Korean Intellectual Property Office, the disclosure of which is incorporated herein by reference.

BACKGROUND OF THE INVENTION

1. Field of the Invention

The embodiments of the invention relate to a solar cell and a method for manufacturing the same, and more particularly, to a solar cell including a dopant layer and a method for manufacturing the same.

2. Description of the Related Art

Recently, as existing energy resources such as oil or coal are expected to be exhausted, an interest in alternative energy resources for replacing oil or coal is increasing. In particular, a solar cell that directly converts or transforms solar energy into electricity using a semiconductor member is gaining attention.

In a solar cell, a p-n junction is formed by forming a dopant layer in order to induce photoelectric conversion, and an electrode electrically connected to the dopant layer of an n-type or a p-type is formed. However, a doping profile of the dopant layer is not easily controlled, and properties of the dopant layer deteriorate, thereby reducing efficiency of the solar cell.

SUMMARY OF THE INVENTION

The embodiments of the invention are directed to provide a solar cell having enhanced efficiency due to a controlled doping profile and a method for manufacturing the solar cell.

A solar cell according to an embodiment of the invention includes a semiconductor substrate; a first dopant layer formed at one surface of the semiconductor substrate; and a first electrode electrically connected to the first dopant layer. At least a part of the first dopant layer includes a pre-amorphization element, and a concentration of the pre-amorphization element in one portion of the first dopant layer is different from a concentration of the pre-amorphization element in another portion of the first dopant layer.

A method for manufacturing a solar cell according to an embodiment of the invention includes preparing a semiconductor substrate; ion-implanting a pre-amorphization element to form an amorphous layer at least apart of one surface of the semiconductor substrate; ion-implanting a first conductive type dopant to the one surface of the semiconductor substrate to form a first dopant layer; and forming a first electrode electrically connected to the first dopant layer. A concentration of the pre-amorphization element in one portion of the first dopant layer is different a concentration of the pre-amorphization element in another portion of the first dopant layer.

BRIEF DESCRIPTION OF THE DRAWINGS

FIG. 3 is a block diagram for illustrating a method for manufacturing a solar cell according to an embodiment of the invention.

DETAILED DESCRIPTION OF THE EMBODIMENTS

Figure 1:
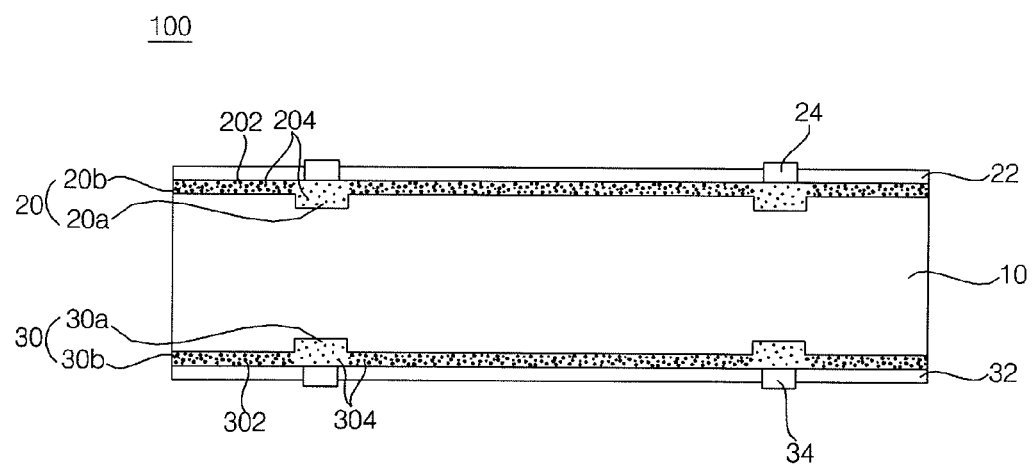
FIG. 1 is a cross-sectional view of a solar cell according to an embodiment of the invention.

Hereinafter, embodiments of the invention will be described with reference to the accompanying drawings. However, the embodiments of the invention are not limited the embodiments, and the various modifications of the embodiments are possible.

In order to clearly and concisely illustrate the embodiments of the invention, members not related to the embodiments of the invention are omitted in the figures. Also, members similar to or the same as each other have the same reference numerals in the figures. In addition, dimensions of layers and regions are exaggerated or schematically illustrated, or some layers are omitted for clarity of illustration. In addition, the dimension of each part as drawn may not reflect an actual size.

In the following description, when a layer or substrate "includes" another layer or portion, it can be understood that the layer or substrate can further include still another layer or portion. Also, when a layer or film is referred to as being "on" another layer or substrate, it can be understood that the layer of film is directly on the other layer or substrate, or intervening layers may also be present. Further, when a layer or film is referred to as being "directly on" another layer or substrate, it can be understood that the layer or film is directly on the another layer or substrate, and thus, there is no intervening layer.

Hereinafter, a solar cell and a method for manufacturing the same according to embodiments of the invention will be described with reference to the accompanying drawings.

Figure 2:
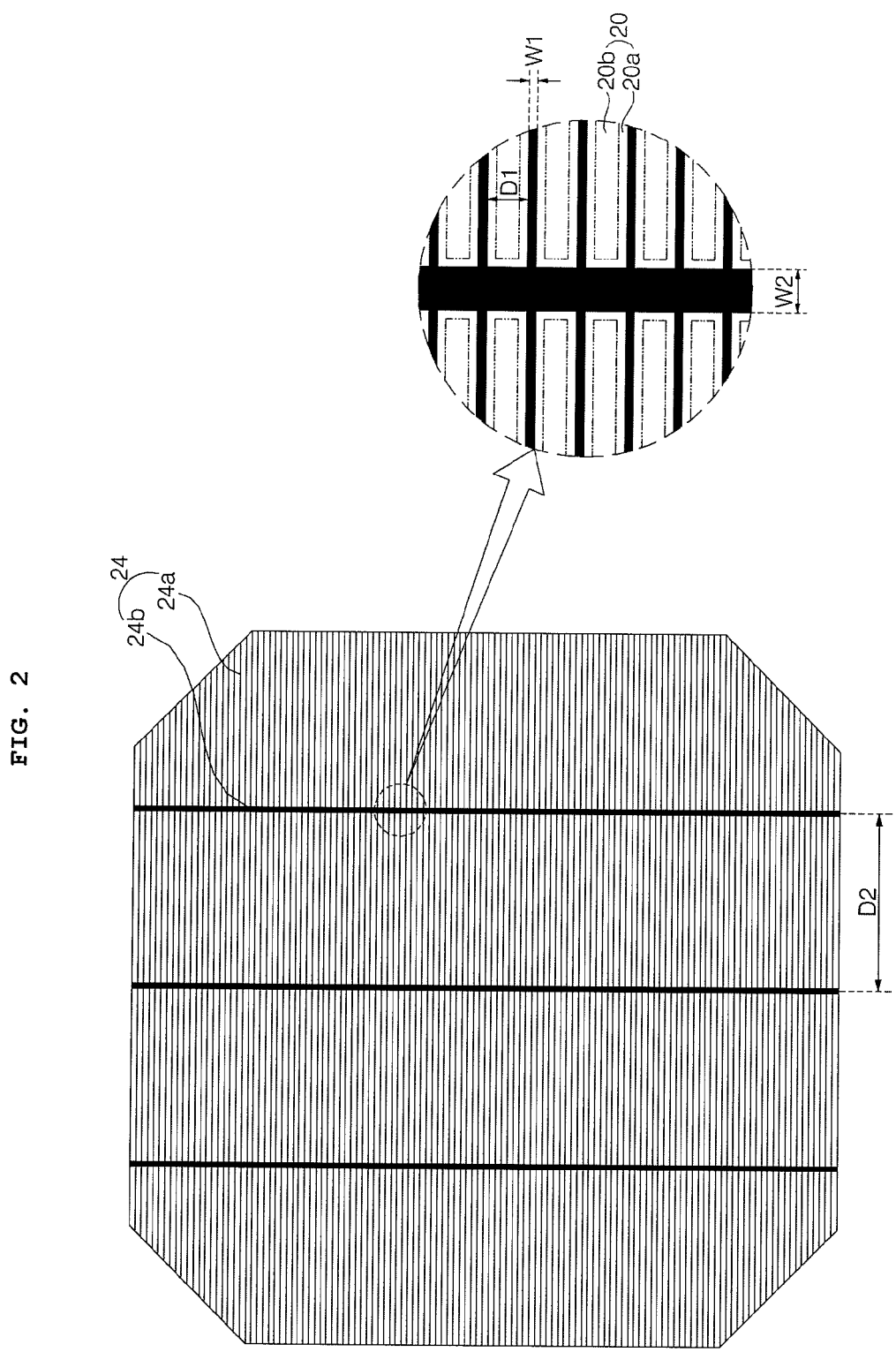
FIG. 2 is a schematic plan view of an emitter layer and a first electrode of the solar cell shown in FIG. 1.

FIG. 1 is a cross-sectional view of a solar cell according to an embodiment of the invention, and FIG. 2 is a schematic plan view of an emitter layer and a first electrode of the solar cell shown in FIG. 1.

Referring to FIGS. 1 and 2, a solar cell 100 according to an embodiment includes a semiconductor substrate 10, dopant layers 20 and 30 formed at the semiconductor substrate 10, and electrodes 24 and 34 electrically connected to the semiconductor substrate 10 or the dopant layers 20 and 30. More specifically, the dopant layers 20 and 30 may include a first dopant layer (hereinafter, referred to as "an emitter layer") 20 formed at or adjacent to a first surface (hereinafter, referred to as "a front surface") of the semiconductor substrate 10, and a second dopant layer (hereinafter, referred to as "a back surface field layer") 30 formed at or adjacent to a second surface (hereinafter, referred to as "a back surface") of the semiconductor substrate 10. Also, the electrodes 24 and 34 may include a first electrode (or a plurality of first electrodes) 24 electrically connected to the emitter layer 20, and a second electrode (or a plurality of second electrodes) 34 electrically connected to the semiconductor substrate 10 or the back surface field layer 30. In addition, the solar cell 100 may further include an anti-reflection layer 22 and a passivation layer 32. This will be described in more detail.

The semiconductor substrate 10 may include one or more of various semiconductor materials. For example, the semiconductor substrate 10 may include silicon having a dopant of a second conductivity type. Single crystal silicon or polycrystalline silicon may be used for the silicon, and the second conductivity type may be an n-type. That is, the semiconductor substrate 10 may include single crystal silicon or polycrystalline silicon having a group V element, such as phosphorus (P), arsenic (As), bismuth (Bi), antimony (Sb), or the like.

When the semiconductor substrate 10 has the n-type dopant as in the above, the emitter layer 20 of a p-type is formed at the front surface of the semiconductor substrate 10, and thereby forming a p-n junction. When light, such as sun light, is incident to the p-n junction, electron-hole pairs are generated, and the electrons generated by the photoelectric effect moves to the back surface of the semiconductor substrate 10 and are collected by the second electrode 34, and the holes generated by the photoelectric effect moves to the front surface of the semiconductor substrate 10 and are collected by the first electrode 24. Then, electric energy is generated thereby.

In this instance, the holes having mobility lower than that of the electrodes move to the front surface of the semiconductor substrate 10, not the back surface of the semiconductor substrate 10. Therefore, the conversion efficiency of the solar cell 100 can be enhanced.

The front and/or back surfaces of the semiconductor substrate 10 may be a textured surface to have protruded and/or depressed portions of various shapes (such as a pyramid shape). Thus, surface roughness is increased by the protruded and/or depressed portions, and reflectance of the incident sun light at the front surface of the semiconductor substrate 10 can be reduced by the texturing. Then, an amount of the light reaching the p-n junction between the semiconductor substrate 10 and the emitter layer 20 can increase, thereby reducing an optical loss of the solar cell 100.

However, the embodiments of the invention are not limited thereto, and thus, the protruded and/or depressed portions may be formed at only one surface (especially, the front surface), or there may be no protruded and/or depressed portions at the front and back surfaces.

The emitter layer 20 including a first conductive type dopant 204 may be formed at the front surface of the semiconductor substrate 10. A p-type dopant such as a group III element (for example, boron (B), aluminum (Al), gallium (Ga), indium (In) or the like) may be used for the first conductive type dopant 204. In the embodiment of the invention, the emitter layer 20 includes a pre-amorphization element 202 partially (or locally), as well as the first conductive type dopant 204.

In the embodiment of the invention, the emitter layer 20 includes a first portion 20a, and a second portion 20b other than the first portion 20a. The first portion 20a is adjacent to the first electrode 24 and is in contact with the first electrode 24. Referring to FIG. 2, the first portion 20a is formed at a portion overlapping the first electrode 24. The second portion 20b including the pre-amorphization element 202 (refer to FIG. 1) is formed at the other portion and is apart from the first electrode 24.

The first portion 20a has a relatively high doping concentration and has a relatively low resistance, and the second portion 20b has a relatively low doping concentration and has a relatively high resistance. That is, in the embodiment of the invention, the shallow emitter can be achieved by forming the second portion 20b having the relatively high resistance at a portion where the sun light is incident between adjacent first electrodes 24, and thereby enhancing the current density of the solar cell 100. In addition, contact resistance with the first electrode 24 can be reduced by forming the first portion 20a having the relatively low resistance at a portion that is in contact with the first electrode 24. That is, when the emitter layer 20 has the selective emitter structure, the efficiency of the solar cell 100 can be increased or maximized.

When the first portion 20a is thin, the first electrode 24 may penetrate the first portion 20a and be in contact with the semiconductor substrate 10 where the emitter layer 20 is not formed, thereby inducing a shunt. Thus, in the embodiment of the invention, the first portion 20a may be thicker than the second portion 20b. That is, a junction depth of the first portion 20a may be deeper than that of the second portion 20b.

In this instance, in the embodiment of the invention, only apart of the emitter layer 20 (that is, the second portion 20b having the relatively high resistance) includes the pre-amorphization element 202, and the first portion 20a does not include the pre-amorphization element 202. That is, the first portion 20a includes the first conductive type dopant 204 only, and the second portion 20b includes both the first conductive type dopant 204 and the pre-amorphization element 202.

The pre-amorphization element 202 is an element for forming an amorphous layer at the semiconductor substrate 10 before doping the first conductive type dopant 204 to the semiconductor substrate 10. The pre-amorphization element may have similar properties with the semiconductor substrate 10 or may be inert elements not reacting with the semiconductor substrate 10, so that the pre-amorphization elements do not affect the properties (e.g., electrical properties) of the semiconductor substrate 10. Thus, the pre-amorphization element 202 may be argon, silicon, germanium, fluorine, and so on.

The pre-amorphization element 202 may have an atomic number the same as or larger than that of the first conductive type dopant 204, and mass and size of the pre-amorphization element 202 may be the same as or larger than the first conductive type dopant 204. However, by increasing a dose and an ion-implantation energy of the pre-amorphization element 202 during an ion-implantation, an element (such as the fluorine) being smaller than or having an atomic number smaller than the first conductive type dopant 204 or the element constituting semiconductor substrate 10 may be used for the pre-amorphization element 202.

Since the pre-amorphization element 202 is included only in the second portion 20b, a projected range (Rp) of the first conductive type dopant 204 in the second portion 20b can be controlled. On the other hand, conventionally, when a light ion such as boron is used for the first conductive type dopant 204, the ion can be implanted deeper than a general projected range (or an ion-implantation depth) by a channeling effect. Therefore, controlling the projected range is difficult. This problem is more seriously generated at the second portion 20b than the first portion 20a that is in contact with the first electrode 24 and is a relatively thick. Accordingly, in the embodiment of the invention, after a pre-amorphization of a portion corresponding to the second portion 20b of the semiconductor substrate 10, the first conductive type dopant 204 is ion-implanted. Thus, the projected range of the first conductive type dopant 204 can be controlled at the second portion 20b. For this reason, sheet resistance of the second portion 20b can increase. This will be described later in more detail when a method for manufacturing the solar cell 100 is described.

In the embodiment of the invention, the second portion 20b is thin (or relatively thinner), and thus, is effectively recovered during a heat-treatment for activation performed after the ion-implantation. Likewise, in the embodiment of the invention, the efficiency of the solar cell 100 can be enhanced by optimizing a doping profile of the emitter layer 20. Also, the pre-amorphization element 202 acts as a Bettering element, and thus, property of the solar cell 100 can be enhanced even more.

In the second portion 20b, a concentration of the pre-amorphization element 202 may be higher than a concentration of the first conductive type dopant 204. Then, by sufficiently forming the amorphous layer at the portion corresponding to the second portion 20b, the projected range of the first conductive type dopant 204 at the second portion 20b can be effectively controlled.

For example, in the second portion 20b, the concentration of the pre-amorphization element 202 is about 3 to 20 times the concentration of the first conductive type dopant 204. This is caused by a difference in dose. When a concentration ratio is less than 3 times, the portion corresponding to the second portion 20b may become not sufficiently amorphous and the controlling of the projected range of the first conductive type dopant 204 may be difficult. When the concentration ratio is more than 20 times, the concentration of the pre-amorphization element 202 may be too high and the emitter layer 20 may be deteriorated. For considering a sufficient amorphization and a greater enhancement of the property of the emitter layer 20, the concentration ratio may be about 5 to 15 times.

As in the above, a thickness of the second portion 20b can be controlled by the pre-amorphization element 202. For example, the first portion 20a may have a thickness of about 0.8 to 2.0 μm, and the second portion 20b may have a thickness of about 0.1 to 0.6 μm. However, the embodiments of the invention are not limited thereto. The thicknesses of the first and second portions 20a and 20b may be varied.

The anti-reflection layer 22 and the first electrode 24 may be formed on the emitter 20 at the front surface of the semiconductor substrate 10.

The anti-reflection layer 22 may be formed substantially at the entire front surface of the semiconductor substrate 10, except for the portion where the first electrode 24 is formed. The anti-reflection layer 22 reduces reflectance (or reflectivity) of sun light incident to the front surface of the semiconductor substrate 10. By reducing the reflectance of sun light incident to the front surface of the semiconductor substrate 10, an amount of the sun light reaching the p-n junction formed between the semiconductor substrate 10 and the emitter layer 20 can be increased, thereby increasing a short circuit current (Isc) of the solar cell 100.

Also, the anti-reflection layer 22 passivates defects at a surface or a bulk of the emitter layer 20. By passivating the defects at the emitter layer 20, recombination sites of minority carrier are reduced or eliminated, thereby increasing an open-circuit voltage (Voc) of the solar cell 100. Accordingly, the open-circuit voltage and the short-circuit current of the solar cell 100 can be increased by the anti-reflection layer 22, and thus, the efficiency of the solar cell 100 can be enhanced.

The anti-reflection layer 22 may include one or more of various materials. For example, the anti-reflection layer 22 may include a silicon nitride layer. However, the embodiments of the invention are not limited thereto. Thus, the anti-reflection layer 22 may have a single film structure or a multi-layer film structure including, for example, at least one material selected from a group consisting of silicon nitride, silicon nitride including hydrogen, silicon oxide, silicon oxy nitride, $MgF_2$, ZnS, $TiO_2$ and $CeO_2$.

The first electrode 24 is electrically connected to the emitter layer 20 by penetrating the anti-reflection layer 22 at the front surface of the semiconductor substrate 10. The first electrode 24 may have various shapes in a plan view. For example, as shown in FIG. 2, the first electrode 24 may include a plurality of finger electrodes 24a. The finger electrodes 24a are parallel to each other and are spaced apart from each other with a first distance D1. Also, the first electrode 24 may include a bus electrode 24b being extended in a direction crossing the finger electrodes 24a to connect the finger electrodes 24a. The bus electrode 24b may include a single bus electrode 24b, or the bus electrode 24b may include a plurality of bus electrodes 24b as shown in FIG. 2. The plurality of bus electrodes 24b are spaced apart from each other with a second distance D2 larger than the first distance D1. Also, the finger electrode 24a may have a width W1 smaller than a width W2 of the bus bar electrode 24b. However, the embodiments of the invention are not limited thereto. Thus, the finger electrode 24a may have the width W1 same as the width W2 of the bus bar electrode 24b. That is, the shape of the first electrode 24 is just an example, and the embodiments of the invention are not limited thereto. Also, the first electrode 24 may include one or more or various materials. Examples of such materials may include silver (Ag), or other metals.

Referring to FIG. 1 again, the back surface field layer including the second conductive type dopant with a high concentration is formed at the back surface of the semiconductor substrate 10. An n-type dopant such as a group V element (such as phosphorus (P), arsenic (As), bismuth (Bi), antimony (Sb), or the like) may be used as the second conductive type dopant 304. In the embodiment of the invention, the back surface field layer 30 may include a pre-amorphization element 302 partially (or locally), as well as the second conductive type dopant 304. This will be described in more detail.

In the embodiment of the invention, the back surface field layer 30 includes a first portion 30a, and a second portion 30b other than the first portion 30a. The first portion 30a is adjacent to the second electrode 34 and is in contact with the second electrode 34. The structures of the shape of the back surface field layer 30 and the second electrode 34 in a plan view are similar to the structure of the shape of the emitter layer 20 and the first electrode 24 in a plan view shown in FIG. 2. Thus, a detailed description is omitted.

The first portion 30a has a relatively high doping concentration and has a relatively low resistance, and the second portion 30b has a relatively low doping concentration and has a relatively high resistance. That is, in the embodiment of the invention, the recombination of the electrons and holes can be reduced or prevented by forming the second portion 30b having the relatively high resistance at a portion between the adjacent second electrodes 34, and thereby enhancing the current density of the solar cell 100. In addition, contact resistance with the second electrode 34 can be reduced by forming the first portion 30a having the relatively low resistance at a portion that is in contact with the second electrode 34. That is, when the back surface field layer 30 has the selective back surface field structure, the efficiency of the solar cell 100 can be increased or maximized.

Also, as the first portion 20a is thicker than the second portion 20b at the emitter layer 20, the first portion 30a also may be thicker than the second portion 30b at the back surface field layer 30.

In this instance, in the embodiment of the invention, only a part of the back surface field layer 30 (that is, the second portion 30b having the relatively high resistance) includes the pre-amorphization element 302, and the first portion 30a does not include the pre-amorphization element 302. That is, the first portion 30a includes the second conductive type dopant 304 only, and the second portion 30b includes both the second conductive type dopant 304 and the pre-amorphization element 302. The pre-amorphization element 302 is similar to the pre-amorphization element 202, and thus, a detailed description is omitted.

The pre-amorphization element 302 may have an atomic number the same as or larger than that of the second conductive type dopant 304, and mass and size of the pre-amorphization element 302 may be the same as or larger than the second conductive type dopant 304. However, by increasing a dose and an ion-implantation energy of the pre-amorphization element 302 during the ion-implantation, an element (such as the fluorine) being smaller than or having an atomic number smaller than the second conductive type dopant 304 or the element constituting semiconductor substrate 10 may be used for the pre-amorphization element 302.

Since the pre-amorphization element 302 is included only in the second portion 30b, a projected range of the second conductive type dopant 304 at the second portion 30b can be controlled. Also, sheet resistance of the second portion 30b can increase. Likewise, in the embodiment of the invention, the efficiency of the solar cell 100 can be enhanced by optimizing a doping profile of the back surface field layer 30.

In the second portion 30b, a concentration of the pre-amorphization element 302 may be higher than a concentration of the second conductive type dopant 304. Then, by sufficiently forming the amorphous layer at the portion corresponding to the second portion 30b, the projected range of the second conductive type dopant 304 at the second portion 30b can be effectively controlled.

For example, in the second portion 30b, the concentration of the pre-amorphization element 302 is about 3 to 20 times the concentration of the second conductive type dopant 304. This is caused by a difference in dose. When a concentration ratio is less than 3 times, the portion corresponding to the second portion 30b may become insufficiently amorphous and the controlling of the projected range of the second conductive type dopant 304 may be difficult. When the concentration ratio is more than 20 times, the concentration of the pre-amorphization element 302 may be too high and the back surface field layer 30 may be deteriorated. For considering a sufficient amorphization and a greater enhancement of the property of the back surface field layer 30, the concentration ratio may be about 5 to 15 times.

The passivation layer 32 and the second electrode 34 may be formed at the back surface of the semiconductor substrate 10.

The passivation layer 32 may be formed substantially at the entire back surface of the semiconductor substrate 10, except for the portions where the second electrode 34 is formed. The passivation layer 32 passivates defects at the back surface of the semiconductor substrate 10, and eliminates the recombination sites of minority carrier. Thus, an open circuit voltage of the solar cell 100 can be increased.

The passivation layer 32 may include a transparent insulating material for passing the light. Thus, the light can be incident to the back surface of the semiconductor substrate 10 through the passivation layer 32, and thereby enhancing the efficiency of the solar cell 100. The passivation layer 32 may have a single film structure or a multi-layer film structure including, for example, at least one material selected from a group consisting of silicon nitride, silicon nitride including hydrogen, silicon oxide, silicon oxy nitride, $MgF_2$, $ZnS$, $TiO_2$ and $CeO_2$. However, the embodiments of the invention are not limited thereto, and thus, the passivation film 32 may include one or more of various materials.

The second electrode 34 may include a metal having a high electric conductivity. The structure of the second electrode 34 is similar to the structure of the first electrode 24 shown in FIG. 2, and detailed descriptions thereof are omitted.

In the embodiment of the invention, the emitter layer 20 and the back surface field layer 30, which are the dopant layers, include the pre-amorphization element 202 and 302 partially (or locally). Therefore, the thicknesses of the second portions 20b and 30b not in contact with the electrode 24 and 34 can be controlled and the properties of the second portions 20b and 30b can be enhanced. Accordingly, the efficiency of the solar cell 100 can be enhanced.

Hereinafter, a method for forming a solar cell according to an embodiment of the invention will be described in more detail with reference to FIG. 3, and FIGS. 4a to 4g. In the following description, any described portions already described above will be omitted, and any portions not already described above will be described in detail.

FIG. 3 is a block diagram for illustrating a method for manufacturing a solar cell according to an embodiment of the invention. FIGS. 4a to 4g are cross-sectional views for illustrating the method for manufacturing the solar cell according to the embodiment of the invention.

Referring to FIG. 3, a method for manufacturing a solar cell according to the embodiment includes an operation ST10 for preparing a semiconductor substrate, an operation ST20 for ion-implanting a pre-amorphization element, an operation ST30 for ion-implanting a first conductive type dopant, an operation ST40 for ion-implanting a second conductive type dopant, an operation ST50 for heat-treating for activation, an operation ST60 for forming an anti-reflection film and a passivation film, and an operation ST70 for forming an electrode.

Figure 4A:
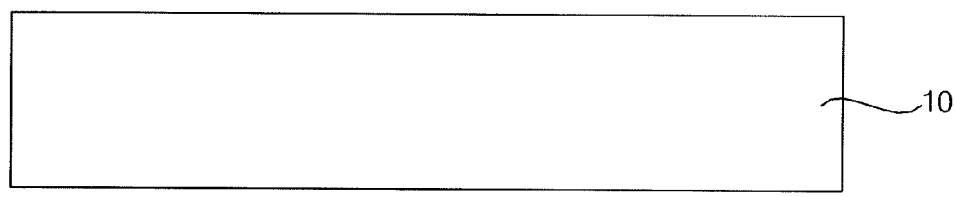
FIGS. 4a to 4g are cross-sectional views for illustrating the method for manufacturing the solar cell according to the embodiment of the invention.

First, as shown in FIG. 4a, in the operation ST10 for preparing the semiconductor substrate, a semiconductor substrate 10 having a second conductive type dopant is prepared. The front and back surfaces of the silicon semiconductor substrate 10 may be textured to have protruded and/or dented portions of various shapes (or to have an uneven surface). For the texturing method, a wet etching method or a dry etching method may be used. In the wet etching method, the substrate 10 may be dipped into a texturing solution. According to the wet etching method, the process time can be short. In the dry etching method, the surface of the semiconductor substrate 10 is etched by a diamond drill or a laser. In the dry etching method, the protruded and/or dented portions can be uniformly formed, though the semiconductor substrate 10 may be damaged and the process time may be long. Accordingly, the semiconductor substrate 10 may be textured by one or more of various methods.

Figure 4B:
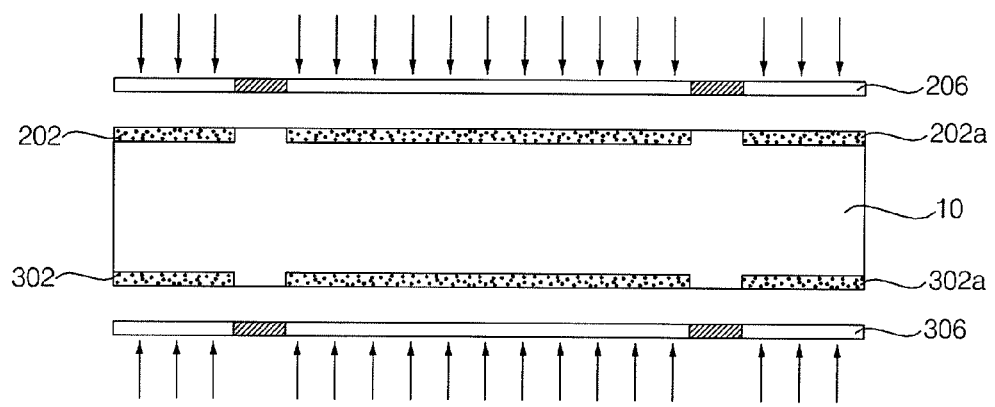

Next, as shown in FIG. 4b, in step ST20 for ion-implanting a pre-amorphization element, the pre-amorphization element 202 is ion-implanted into the front surface of the semiconductor substrate 10 partially (or locally), and the pre-amorphization element 302 is ion-implanted into the back surface of the semiconductor substrate 10 partially (or locally). More specifically, the pre-amorphization elements 202 and 302 are ion-implanted to portions corresponding to second portions 20b and 30b (refer to FIG. 1) of dopant layers (refer to FIG. 1). In this instance, masks 206 and 306 having opening portions formed at the portion corresponding to second portions 20b and 30b may used so that the pre-amorphization elements 202 and 302 are ion-implanted partially (or locally). However, the present invention is not limited thereto.

Accordingly, a first amorphous portion 202a is formed at a portion corresponding to the second portion 20b of an emitter layer (refer to FIG. 1) at the front surface of the semiconductor substrate 10, and a second amorphous portion 302a is formed at a portion corresponding to the second portion 30b of an back surface field layer 30 (refer to FIG. 1) at the back surface of the semiconductor substrate 10.

In this instance, the dose of the pre-amorphization element 202 or 302 may be in a range of about $1 \times 10^{14}$ to $9 \times 10^{16}$ atoms/cm$^2$. This dose range is determined to sufficiently form the first or second amorphous portion 202a or 302a at the semiconductor substrate 10. The dose of the pre-amorphization element 202 and 302 may be larger than the dose of a first or second conductive type dopant 204 or 304 (that will be ion-implanted in the operations 30 and 40), respectively. This is for reducing or preventing the first and second conductive type dopants 204 and 304 from being deeply implanted by sufficiently forming the first and second amorphous portions 202a and 302a. As described above, the doses of the pre-amorphization elements 202 and 302 may be about 3 to 20 times the doses of the first and second conductive type dopants 204 and 304, respectively.

The ion-implantation energy of each of the pre-amorphization elements 202 and 302 may be in a range of about 0.1 to 100 keV. This ion-implantation energy range is determined to sufficiently form the first or second amorphous portion 202a or 302a at the semiconductor substrate 10. The ion-implantation energy of the pre-amorphization elements 202 and 302 may be larger than the ion-implantation energy of a first or second conductive type dopant 204 or 304 (that will be ion-implanted in the operations 30 and 40), respectively. This is for reducing or preventing the first and second conductive type dopant 204 and 304 from being deeply implanted by sufficiently forming the first and second amorphous portions 202a and 302a.

In the embodiment of the invention, after ion-implanting the pre-amorphization element 202 to the front surface of the semiconductor substrate 10, the pre-amorphization element 302 may be ion-implanted to the back surface of the semiconductor substrate 10. Selectively (or alternatively), after ion-implanting the pre-amorphization element 302 to the back surface of the semiconductor substrate 10, the pre-amorphization element 202 may be ion-implanted to the front surface of the semiconductor substrate 10.

Figure 4C:
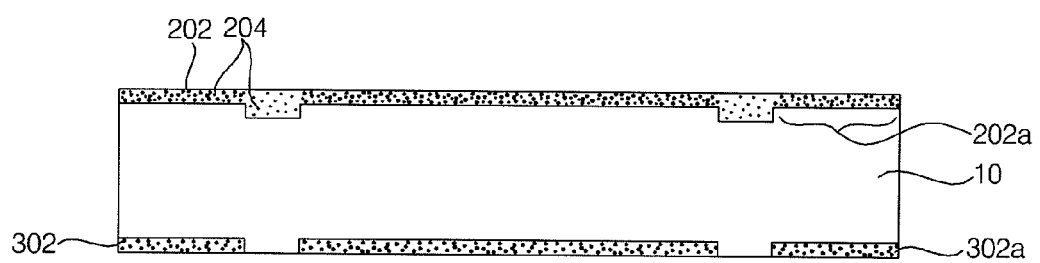

Next, as shown in FIG. 4c, in the operation ST30 for ion-implanting a first conductive type dopant, a first conductive type dopant 204 such as boron or gallium is ion-implanted to the entire front surface of the semiconductor substrate 10.

In this instance, the first conductive type dopant 204 may be ion-implanted to the front surface of the semiconductor substrate 10 with a uniform dose. Selectively (or alternatively), the dose of the first conductive type dopant 204 at the first portion 20a may larger than the dose of the first conductive type dopant 204 at the second portion 20b. When there is a dose difference between the first portion 20a and the second portion 20b, a comb mask may be used. However, the embodiments of the invention are not limited thereto. Thus, the number of the ion-implantation process may be different at the first and second portions 20a and 20b. Other methods may be used.

When the first conductive type dopant 204 is ion-implanted to the entire front surface of the semiconductor substrate 10, at the first amorphous portion 202a corresponding to the second portion 20b, the first conductive type dopant 204 is implanted only to the first amorphous portion 202a. Accordingly, the projected range of the second portion 20b can be controlled. On the other hand, at the portion corresponding to the first portion 20a, the first amorphous portion 202a is not formed and the first conductive type dopant 204 is deeply implanted more than the first amorphous portion 202a.

In this instance, the dose of the first conductive type dopant 204 may be in a range of about $1 \times 10^{14}$ to $9 \times 10^{15}$ atoms/cm$^2$, and the ion-implantation energy thereof may be in a range of about 0.1 to 30 keV. This is determined so that the emitter layer 20 can have a suitable resistance based on the concentration of the first conductive type dopant 204, and so that the damage of the semiconductor substrate 10 can be reduced or prevented.

Figure 4D:
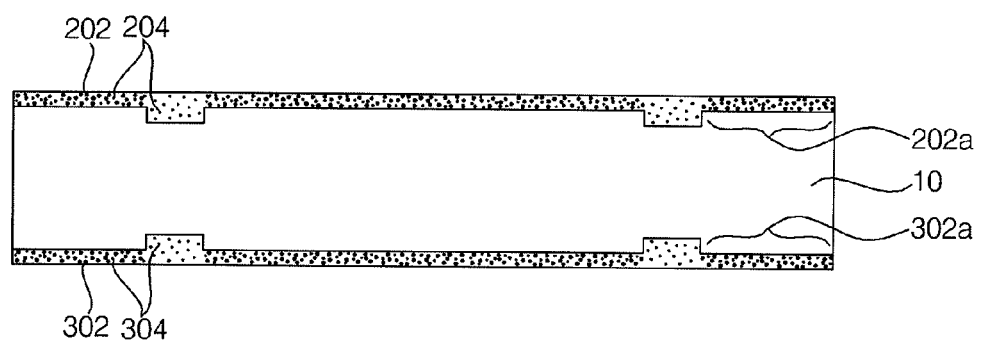

Next, as shown in FIG. 4d, in the operation ST40 for ion-implanting a second conductive type dopant, a second conductive type dopant 304 such as phosphorus is ion-implanted to the entire back surface of the semiconductor substrate 10.

In this instance, the second conductive type dopant 304 may be ion-implanted to the back surface of the semiconductor substrate 10 with a uniform dose. Selectively (or alternatively), the dose of the second conductive type dopant 304 at a first portion 30a may larger than the dose of the second conductive type dopant 304 at a second portion 30b. When there is a dose difference between the first portion 30a and the second portion 30b, a comb mask may be used. However, the embodiments of the invention are not limited thereto. Thus, the number of the ion-implantation process may be different at the first and second portions 30a and 30b. Other methods may be used.

When the second conductive type dopant 304 is ion-implanted to the entire back surface of the semiconductor substrate 10, at the second amorphous portion 302a corresponding to the second portion 30b, the second conductive type dopant 304 is implanted only to the second amorphous portion 302a. Accordingly, the projected range of the second portion 30b can be controlled. On the other hand, at the portion corresponding to the first portion 30a, the second amorphous portion 302a is not formed and the second conductive type dopant 304 is deeply implanted more than the second amorphous portion 302a.

In this instance, the dose of the second conductive type dopant 304 may be in a range of about $1 \times 10^{14}$ to $9 \times 10^{15}$ atoms/cm$^2$, and the ion-implantation energy thereof may be in a range of about 0.1 to 30 keV. This is determined so that the back surface field layer 30 can have a suitable resistance based on the concentration of the second conductive type dopant 304, and so that the damage of the semiconductor substrate 10 can be reduced or prevented.

In the embodiment of the invention, after ion-implanting the first conductive type dopant 204, the second conductive type dopant 304 is ion-implanted. However, the present invention is not limited thereto. Therefore, after ion-implanting the second conductive type dopant 304, the first conductive type dopant 204 may be implanted.

Also, in the embodiment of the invention, before ion-implanting of the first conductive type dopant 204 and the second conductive type dopant 304, both of the pre-amorphization elements 202 and 302 are ion-implanted. However, the present invention is not limited thereto. Therefore, the ion-implantation sequence may be varied if the condition (that is, the pre-amorphization element 202 is ion-implanted before the first conductive type dopant 204 is ion-implanted, and the pre-amorphization element 302 is ion-implanted before the second conductive type dopant 304 is ion-implanted) is satisfied.

Figure 4E:
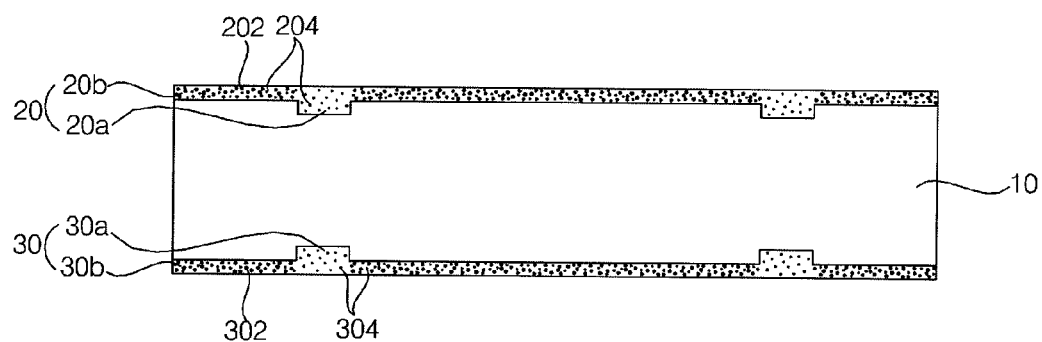

Next, as shown in FIG. 4e, in the operation ST50 for heat-treating for activation, the first conductive type dopant 204 and the second conductive type dopant 304 ion-implanted to the semiconductor substrate 10 are activated by heat. Accordingly, an emitter layer 20 including the first and second portion 20a and 20b are formed at the front surface of the semiconductor substrate 10, and a back surface field layer 30 including the first and second portion 30a and 30b are formed at the back surface of the semiconductor substrate 10.

In this instance, because the portions corresponding to the second portions 20b and 30b of the semiconductor substrate 10 are amorphous by the pre-amorphization elements 202 and 302, growth through solid phase epitaxy is induced. Accordingly, the second portions 20b and 30b can be easily recovered, and the sheet resistance of the second portions 20b and 30b can increase. Also, the first and second conductive type dopants at the first portions 20a and 30a are diffused deeply into an inside of the semiconductor substrate 10, and the first portions 20a and 30a become thicker.

When the first conductive type dopant 204 and the second conductive type dopant 304 are co-activated, the temperature of the heat-treating may be about 900 to 1200° C. When the temperature is higher than about 1200° C., problems due to the high temperature may be generated. When the temperature is lower than about 900° C., the activation and the solid state epitaxy may be not induced sufficiently. By the co-activation, the process can be simple and the productivity can be increased.

However, the embodiments of the invention are not limited thereto. Thus, the first conductive type dopant 204 may be ion-implanted, and then, the first conductive type dopant 204 may be heat-treated for the activation. After that, the second conductive type dopant 304 may be ion-implanted, and then, the second conductive type dopant 304 may be heat-treated for the activation. When the activation of the first conductive type dopant 204 and the activation of the second conductive type dopant 304 are separately performed, the heat-treating can be performed at the temperature suitable for the activation of each dopant.

Figure 4F:
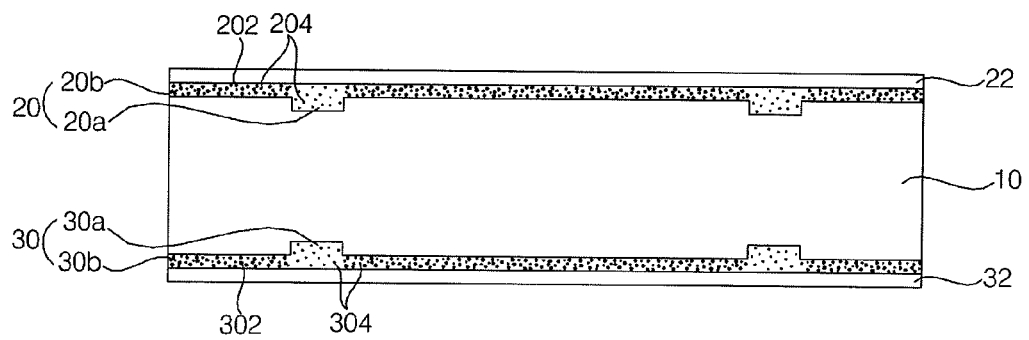

Next, as shown in FIG. 4f, in the operation ST60 for forming the anti-reflection film and the passivation film, an anti-reflection film 22 and a passivation film 32 are formed on the front surface and the back surface of the semiconductor substrate 10, respectively. The anti-reflection film 22 and the passivation film 32 may be formed by one or more of various methods such as vacuum evaporation, chemical vapor deposition, spin coating, screen printing, or spray coating.

Figure 4G:
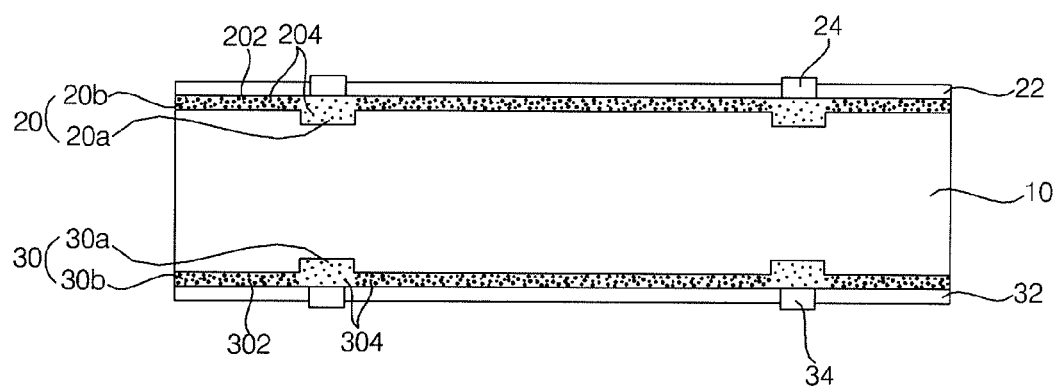

Next, as shown in FIG. 4g, in the operation ST70 for forming the electrode, a first electrode 24 electrically connected to the emitter layer 20 is formed at the front surface of the semiconductor substrate 10 and a second electrode 34 electrically connected to the back surface field layer 30 is formed at the back surface of the semiconductor substrate 10.

After forming an opening at the anti-reflection layer 22, the first electrode 24 may be formed inside the opening by one or more of various methods, such as a plating method or a deposition method. Also, after forming an opening at the second passivation layer 32, the second electrode 34 may be formed inside the opening by one or more of various methods, such as a plating method or a deposition method.

Selectively (or alternatively), the first and second electrodes 24 and 34 may be formed by fire-through or laser firing contact of printed pastes for the first and second electrodes 24 and 34. For example, the pastes may be printed by various methods such as a screen printing method. In this instance, because the openings are naturally (or automatically) formed during the fire-through or the laser firing contact, separate operations for forming the openings and are not necessary.

In the embodiment of the invention, before ion-implanting the first and second conductive type dopants 204 and 304, the pre-amorphization elements 202 and 302 are partially (or locally) ion-implanted (more specifically, the pre-amorphization elements 202 and 302 are ion-implanted to the second portions 20b and 30b that are not in contact with the electrode 24 and 34). Accordingly, the first and second amorphous portions 202a and 302a are formed to correspond to the second portions 20b and 30b, respectively. Then, when the first and second conductive type dopants 204 and 304 are ion-implanted, at the first and second amorphous portions 202a and 302a, the first and second conductive type dopants 204 and 304 are implanted only to the first and second amorphous portions 202a and 302a. Thus, the projected range can be controlled. Accordingly, the second portions 20b and 30b during the heat-treating for the activation can be easily recovered, and the sheet resistance of the second portions 20b and 30b can increase. Accordingly, the properties of the emitter layer 20 and the back surface field layer 30 can be enhanced, thereby enhancing the solar cell 100.

Figure 5:
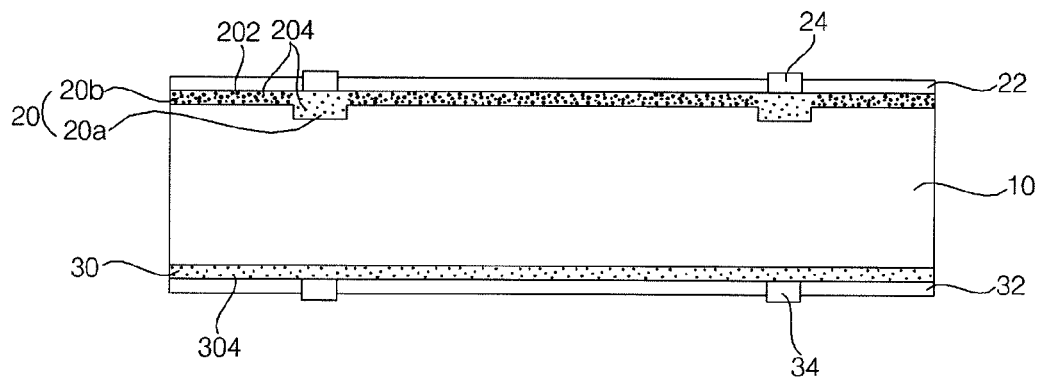
FIG. 5 is a cross-sectional view of a solar cell according to another embodiment of the invention.
Figure 6:
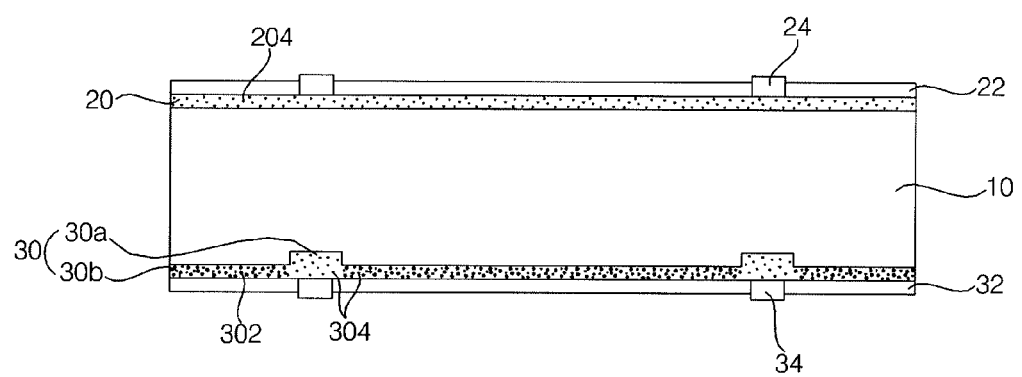
FIG. 6 is a cross-sectional view of a solar cell according to yet another embodiment of the invention.

In the above embodiment of the invention, both of the emitter layer 20 and the back surface field layer 30 include the pre-amorphization element 202 or 302. However, the embodiments of the invention are not limited thereto. Thus, one of the emitter layer and the back surface field layer 30 may include the pre-amorphization element 202 or 302. Also, as shown in FIG. 5, the back surface field layer 30 does not include the pre-amorphization element 302 and includes the second conductive type dopant 304, and the concentration of the second conductive type dopant 304 may be entirely uniform. Selectively (or alternatively), as shown in FIG. 6, the emitter layer 20 does not include the pre-amorphization element 202 and includes the first conductive type dopant 204, and the concentration of the first conductive type dopant 204 may be entirely uniform.

Selectively (or alternatively), one of the dopant layers 20 and 30 may include the pre-amorphization element 202 and 302 partially (or locally), and the other one of the dopant layers 20 and 30 may include the pre-amorphization element 202 or 302 entirely.

In addition, in the above embodiment of the invention, the second portions 20b and 30b of the emitter layer 20 and the back surface field layer 30 include the pre-amorphization elements 202 and 302, respectively, and the first portions 20a and 30a do not include the pre-amorphization elements 202 and 302. However, in the operation ST20 for ion-implanting the pre-amorphization element, although the masks 206 and 306 (refer to FIG. 4b) are used, the pre-amorphization elements 202 and 302 may be implanted to the first portions 20a and 30a. In this instance, the concentration of the pre-amorphization element 202 and 302 in the second portions 20b and 30b are higher than the concentration of the pre-amorphization element 202 and 302 in the first portions 20a and 30a, respectively.

Figure 7:
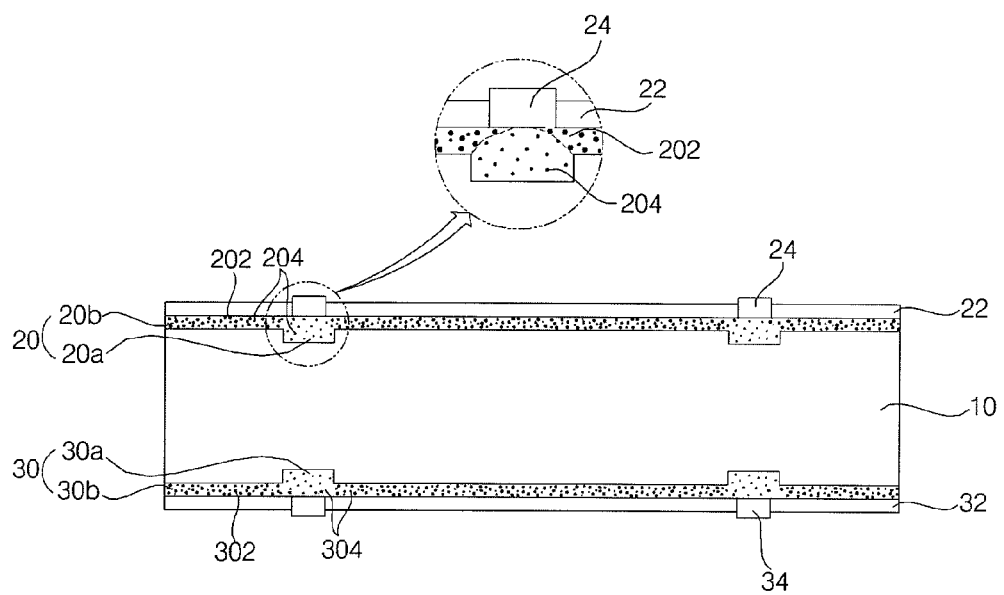
FIG. 7 is a cross-sectional view of a solar cell according to still another embodiment of the invention.

That is, as shown in FIG. 7, the first portions 20a and 30a as well as the second portions 20b and 30b may include the pre-amorphization elements 202 and 302. That is, as shown in a portion of an inside of a dotted line in an enlarged portion of FIG. 7, areas of the first portions 20a and 30a that are adjacent to the second portions 20b and 30b, respectively, may include the pre-amorphization elements 202 and 302. In areas that approach the second portions 20b and 30b, the doping amount and the projected range (ion-implantation depth) may become deeper. Although the masks 206 and 306 are used, this phenomenon of inclusion of the pre-amorphization elements 202 and 302 in portions of the first portions 20a and 30a may be induced by a process error. In FIG. 7 and the related descriptions, a part of the first portions 20a and 30a include the pre-amorphization elements 202 and 302, respectively. However, the embodiments of the invention are not limited thereto. Thus, entire portions of the first portions 20a and 30a may include the pre-amorphization elements 202 and 302 of a low concentration.

In the above embodiment of the invention, the semiconductor substrate 10 and the back surface field layer 30 are the n-types, and the emitter layer 20 is the p-type. However, the embodiments of the invention are not limited thereto. The semiconductor substrate 10 and the back surface field layer 30 may be the p-types, and the emitter layer 20 may be the n-type.

Hereinafter, the embodiments of the invention will be described in more detail through experimental examples. The experimental examples are provided only for illustrative purpose of the embodiments of the invention and the embodiments of the invention are not limited thereto.

Experimental Embodiments

An n-type semiconductor substrate was prepared. Argon was ion-implanted to a front surface and a back surface of the semiconductor substrate. Then, boron as a p-type dopant was ion-implanted to the front surface of the semiconductor substrate, and phosphorus as an n-type dopant was ion-implanted to the back surface of the semiconductor substrate. A heat-treating for activation was performed at a temperature of 1000° C., and an emitter layer and a back surface field layer were formed.

An anti-reflection film was formed on the front surface of the semiconductor substrate, and a passivation film was formed on the back surface of the semiconductor substrate. Then, a first electrode electrically connected to the emitter layer and a second electrode electrically connected to the back surface field layer were formed, and a solar cell was manufactured. A plurality of solar cells were manufactured by differentiating a dose and ion-implantation energy of the argon under the conditions stated in the following Table 1.

Comparative Example

A plurality of solar cells was manufactured by the same method as Experimental Embodiment 1 except that argon is not ion-implanted.

TABLE 1

| | relative value of sheet resistance | relative value of ion-implantation energy | Number of samples |
| --- | --- | --- | --- |
| Experimental Embodiment 1 | 4.5 | 1 | 6 |
| Experimental Embodiment 2 | 3.5 | 1.6 | 6 |
| Experimental Embodiment 3 | 5.5 | 1.6 | 6 |
| Experimental Embodiment 4 | 30 | 2.8 | 6 |
| Experimental Embodiment 5 | 45 | 2.8 | 36 |
| Experimental Embodiment 6 | 60 | 2.8 | 6 |
| Experimental Embodiment 7 | 35 | 4 | 6 |
| Experimental Embodiment 8 | 55 | 4 | 6 |
| Experimental Embodiment 9 | 45 | 4.6 | 6 |

Figure 8:
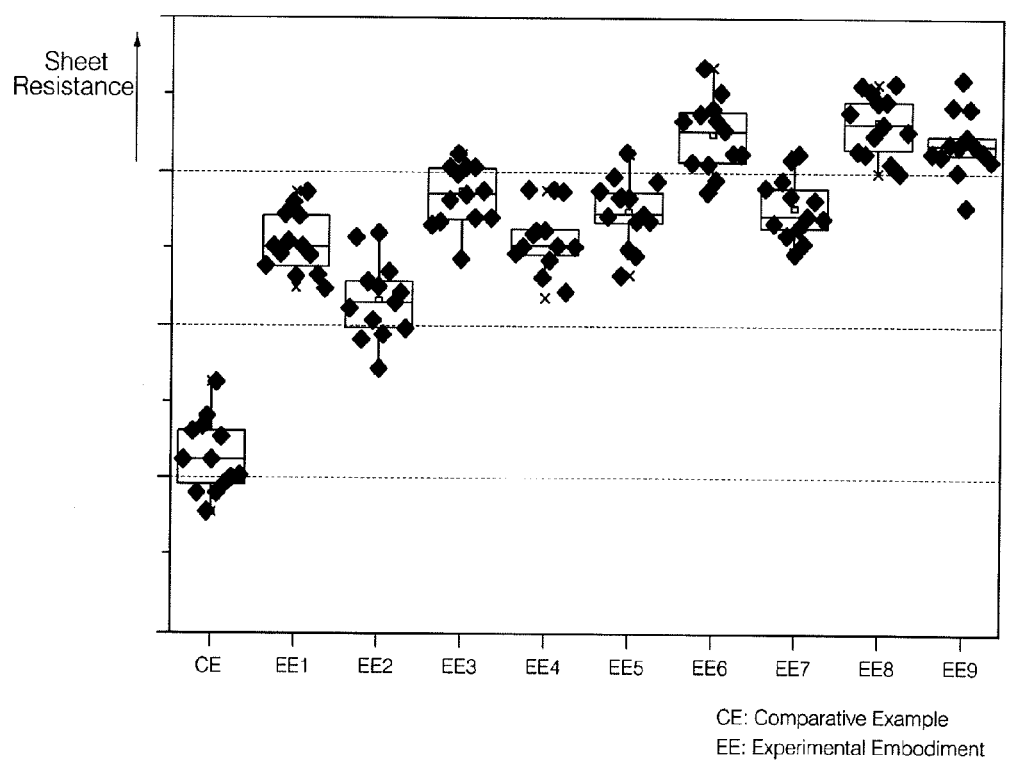
FIG. 8 is a graph of relative values of sheet resistances of a second portion of an emitter where argon is ion-implanted in each of Experimental Embodiments and Comparative Examples.

Relative value of sheet resistance of a second portion of an emitter where argon is ion-implanted in each of Experimental Embodiments and Comparative Examples is measured, and the result is shown in FIG. 8. The relative value of the sheet increases towards the top of the graph shown in FIG. 8.

Referring to FIG. 8, the second portions of emitter layers of the solar cells according to the Experimental Embodiments have high sheet resistances, compared with those according to the Comparative Example. Also, as the dose and the ion-implantation energy of the argon increase, the sheet resistance increases also. That is, in the Experimental Embodiments, the sheet resistance of the second portions increase, and thus, the recombination of the holes and electrons at the second portions can be effectively reduced or prevented.

Certain embodiments of the invention have been described. However, the invention is not limited to the specific embodiments described above, and various modifications of the embodiments are possible by those skilled in the art to which the invention belongs without leaving the scope defined by the appended claims.

What is claimed is:

1. A solar cell, comprising:
a semiconductor substrate;
a first dopant layer formed at one surface of the semiconductor substrate, wherein the first dopant layer includes a first conductive type dopant; and
a first electrode electrically connected to the first dopant layer,
wherein the first dopant layer includes a first portion disposed adjacent to the first electrode and a second portion that is other than the first portion of the first dopant layer,
wherein the second portion of the first dopant layer has a resistance larger than a resistance of the first portion of the first dopant layer,
wherein each of the first portion and the second portion of the first dopant layer has the first conductive type dopant,
wherein at least one of the first portion and the second portion of the first dopant layer includes a pre-amorphization element,
wherein a concentration of the pre-amorphization element in the second portion of the first dopant layer is higher than a concentration of the pre-amorphization element in the first portion of the first dopant layer, wherein the semiconductor substrate has a base dopant having a second conductive type opposite to the first conductive type dopant of each of the first and the second portions of the first dopant layer, and wherein the pre-amorphization element has an atomic number that is larger than an atomic number of the first conductive type dopant.

2. The solar cell according to claim 1, wherein the first portion includes the first conductive type dopant without the pre-amorphization element, and wherein the second portion includes the first conductive type dopant and the pre-amorphization element.

3. The solar cell according to claim 1, wherein the pre-amorphization element includes at least one material selected from the group consisting of argon, germanium, and fluorine.

4. The solar cell according to claim 1, wherein the first portion is thicker than the second portion.

5. The solar cell according to claim 1, wherein, in the second portion, the concentration of the pre-amorphization element is higher than a concentration of the first conductive type dopant.

6. The solar cell according to claim 5, wherein, in the second portion, the concentration of the pre-amorphization element is about 3 to 20 times the concentration of the first conductive type dopant.

7. The solar cell according to claim 1, further comprising:
a second dopant layer formed at another surface of the semiconductor substrate, the second dopant layer including a second conductive type dopant; and
a second electrode electrically connected to the second dopant layer.

8. The solar cell according to claim 7, wherein the second dopant layer includes a third portion disposed adjacent to the second electrode and a fourth portion that is other than the third portion of the second dopant layer, wherein the fourth portion of the second dopant layer has a resistance that is larger than a resistance of the third portion of the second dopant layer, and wherein the fourth portion of the second dopant layer includes an additional pre-amorphization element.

9. The solar cell according to claim 1, wherein each of the first portion and the second portion of the first dopant layer includes the pre-amorphization element.

* * * * *